US006972571B2

(12) United States Patent
Wong et al.

(10) Patent No.: US 6,972,571 B2
(45) Date of Patent: Dec. 6, 2005

(54) LOAD BOARD WITH EMBEDDED RELAY TRACKER

(75) Inventors: Vivien Wong, Selangor (MY); Wai Khuin Phoon, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/805,954

(22) Filed: Mar. 22, 2004

(65) Prior Publication Data

US 2005/0218899 A1 Oct. 6, 2005

(51) Int. Cl.[7] .......................................... G01R 31/327
(52) U.S. Cl. .................................................... 324/418
(58) Field of Search ............................... 324/415–424; 702/57, 117, 122–125; 361/157, 160, 166, 361/183, 191

(56) References Cited

U.S. PATENT DOCUMENTS

| | | | | |
|---|---|---|---|---|
| 4,319,193 A * | 3/1982 | Boccali et al. | 324/418 |
| 4,393,662 A * | 7/1983 | Dirth | 62/115 |
| 4,689,570 A * | 8/1987 | Ohgaki et al. | 324/418 |
| 5,028,873 A * | 7/1991 | Koebke | 324/418 |
| 5,892,449 A * | 4/1999 | Reid et al. | 340/639 |
| 6,166,552 A | 12/2000 | O'Connell | |
| 6,369,593 B1 | 4/2002 | Ott | |
| 6,392,866 B1 | 5/2002 | Dinteman | |
| 6,433,532 B1 | 8/2002 | Boon et al. | |
| 6,437,586 B1 | 8/2002 | Robinson | |
| 6,507,205 B1 | 1/2003 | Dibish et al. | |
| 6,587,979 B1 | 7/2003 | Kraus et al. | |
| 6,625,557 B1 | 9/2003 | Perkins et al. | |
| 6,661,247 B2 | 12/2003 | Maruyama et al. | |
| 6,667,626 B2 | 12/2003 | Takemoto et al. | |
| 6,675,339 B1 | 1/2004 | Lanier et al. | |
| 6,677,744 B1 | 1/2004 | Long | |
| 6,678,645 B1 | 1/2004 | Rajsuman et al. | |
| 2003/0001601 A1 | 1/2003 | Robinson | |
| 2004/0004216 A1 | 1/2004 | Eldridge et al. | |
| 2004/0009682 A1 | 1/2004 | Suzuki et al. | |
| 2004/0012400 A1 | 1/2004 | Sauk et al. | |
| 2004/0013016 A1 | 1/2004 | Yamazaki et al. | |
| 2004/0015314 A1 | 1/2004 | Mayer | |

* cited by examiner

*Primary Examiner*—Anjan Deb
*Assistant Examiner*—Marina Kramskaya
(74) *Attorney, Agent, or Firm*—Charles Bergere

(57) ABSTRACT

A load board includes an embedded relay tracker circuit that counts and stores relay clicks to measure relay usage. Having accurate relay usage data reduces maintenance costs. The relay tracker circuit includes a controller with a counter for counting relay clicks of the load board relays and wires or conductive traces connecting the controller to the relays. Each time a relay switches, a signal is transmitted from the relay to the controller and the controller increments the counter. The count information then is stored in a memory connected to the counter.

17 Claims, 2 Drawing Sheets

LOAD BOARD WITH EMBEDDED RELAY TRACKER

BACKGROUND OF THE INVENTION

The present invention relates generally to semiconductor integrated circuit manufacturing, and more particularly, to a load board used when testing integrated circuits.

Integrated circuits have become increasingly complex and costly to design and manufacture. Very expensive Automated Test Equipment (ATE) systems are used to test integrated circuits, both prior and subsequent to packaging. Circuits or devices being tested are known as DUTS (Device Under Test). An ATE system is connected to a DUT by way of a test interface unit. The ATE system transmits and receives electrical signals to and from each DUT by way of the test interface unit. The test interface unit usually includes a test socket or contactor, an interface or load board, and a test head adaptor. Such testing is critical to ensure IC quality, reduce manufacturing costs, improve the accuracy of manufacturing yield data and identify repairable ICs.

The load board is a multilayer printed circuit board that is used to apply simulated loads across the DUTS. Additionally, load boards provide a convenient location for test points, diagnostic displays and configuration jumpers. Load boards typically use relays, such as pin-through-hole relays, to perform switching in order to minimize signal distortion. These relays are expensive and have a limited life span. Faulty relays are the main cause of load board and test failures and so the load board relays are replaced at regular intervals, whether they are faulty or not.

Thus, it would be beneficial to be able to track relay usage to determine accurately the relay usage and thus cut down on unwarranted relay replacements.

BRIEF DESCRIPTION OF THE DRAWINGS

The following detailed description of a preferred embodiment of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

In one embodiment, the present invention is a relay tracker circuit for counting clicks of a plurality of relays on a load board. The relay tracker circuit includes a controller including a counter for counting relay clicks of the plurality of relays. A plurality of wires connects the controller to the relays. Each time a relay switches, a signal is transmitted from the relay to the controller and the controller increments the counter. A memory is connected to the counter for storing the count information for each relay.

In another embodiment, the present invention is a load board for applying simulated loads from a test system to one or more devices under test (DUTS). The load board comprises a plurality of conductive traces for transmitting signals from the test system to the DUTS, a plurality of relays connected to the plurality of traces for performing signal switching, and an embedded relay tracker circuit connected to the plurality of relays for counting relay clicks and generating and storing relay usage information.

Figure 1:
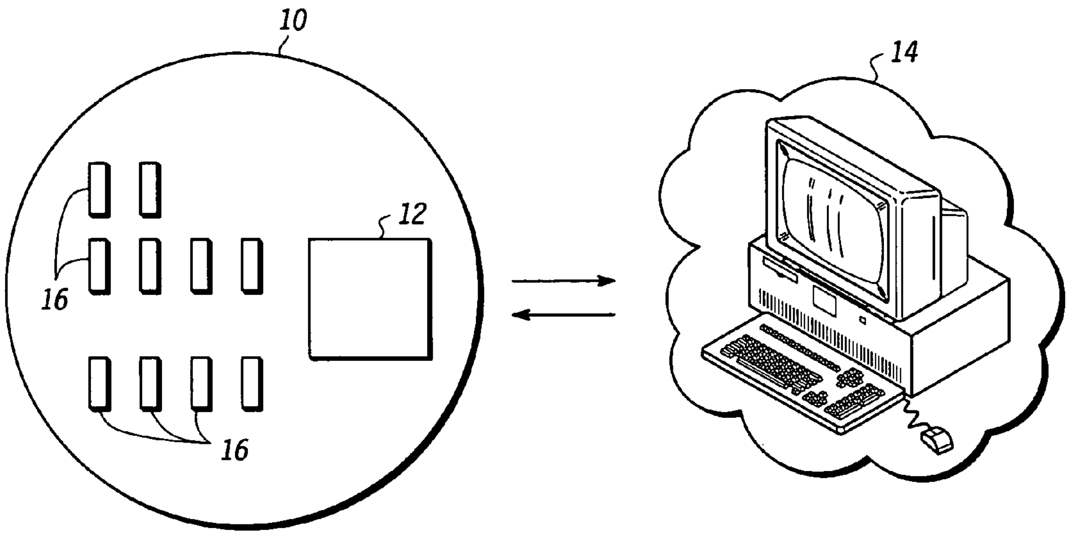
FIG. 1 is a block diagram of a load board with an embedded relay tracker connected to a computer system in accordance with an embodiment of the present invention.

Referring now to FIG. 1, a block diagram of a load board 10 with an embedded relay tracker circuit 12 connected to a computer system 14 in accordance with an embodiment of the present invention is shown. The load board 10 is used for applying simulated loads from a test system (not shown) to one or more devices under test (DUTS). The load board 10 is a multi-layer printed circuit board (PCB) and includes a plurality of conductive traces for transmitting signals from the test system to the DUTS. A plurality of relays 16 are connected to the plurality of traces for performing signal switching. The load board 10, excluding the relay tracker circuit 12, is of a kind well known by those of skill in the art. The relay tracker circuit 12 is provided for counting the relay clicks. That is, each time a relay 16 switches, a counter value for that particular relay is incremented. As discussed in more detail below, the computer 14 receives the relay count information from the relay tracker circuit 12 so that the relay count information can be monitored. The relay count information is used for managing load board maintenance.

Figure 2:
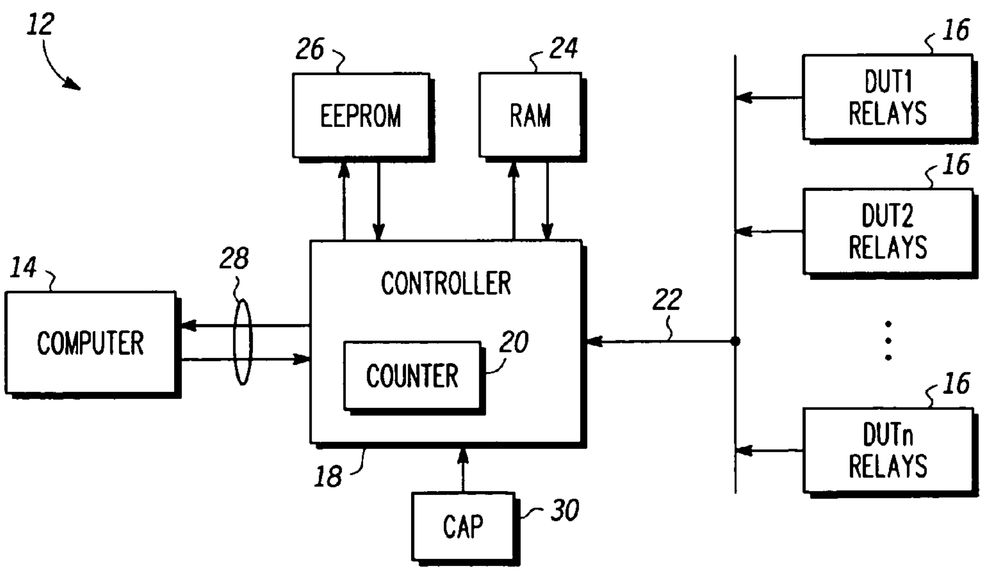
FIG. 2 is a schematic block diagram of the embedded relay tracker of FIG. 1 in accordance with an embodiment of the present invention.

Referring now to FIG. 2, a schematic block diagram of an embodiment of the relay tracker circuit 12 connected between the computer 14 and the relays 16 is shown. The relay tracker circuit 12 includes a controller 18 including a counter 20 for counting relay clicks of the plurality of relays 16. The controller 18 is connected to the plurality relays 16 with wires 22. The plurality of wires 22 is preferably a plurality of conductive traces in one or more metal layers of the load board 10. Each time one of the relays 16 switches, a signal is transmitted from the relay 16 to the controller 18. A count value for the relay 16 that switched is incremented using the counter 20. The updated count value then is stored in a memory, such as a RAM 24 that is connected to the controller 18. In one embodiment of the invention, each relay 16 is allocated about four bytes of space in the RAM 24. Allocating 4 bytes of memory per relay allows for a count value of greater than 4 billion to be saved. As relays typically have a lifespan of about 100 million clicks, this allocation is more than sufficient. However, it will be understood by those of skill in the art that more or less memory space may be allocated for each relay, depending on the types of relays used and there maximum lifespan.

The relay tracker circuit 12 saves the relay count information in the RAM 24 while the load board 10 is connected to a test head (not shown). However, when the load board 10 is powered down or disconnected from the test head, the relay count information in the RAM 24 is moved to a secondary memory, such as an EEPROM 26, that is connected to the controller 18. When the load board 10 is powered up or docked once again, the relay count information stored in the EEPROM 26 will be moved back to the RAM 24 so that the relay click counting resumes where it left off.

In one embodiment, the controller 18, counter 20, RAM 24 and EEPROM 26 are part of a microcontroller, such as the MC68HC908AS60 available from Motorola Inc. of Schaumburg Ill. Thus, the RAM 24 and the EEPROM 26 are integral with the controller 18. The input/output ports of the microcontroller are connected to all of the relay control bits on the load board 10. The RAM 24 is used to store each relay click count, calculated by the microcontroller. When a relay 16 switches (clicks), a voltage difference is detected, and a respective RAM location for the particular clicking relay 16 is updated. A polling method may be used to monitor the microcontroller ports. The microcontroller includes an RS-232 port 28 that allows it to be connected to a serial port of the computer 14, which may be a common personal computer. The relay count information is transmitted from the EEPROM 26 to the computer 14 so that the data may be viewed by an engineer or technician, preferably using a graphical user interface (GUI). An alert is provided once the count for a relay 16 has exceeded a predetermined value. The alert indicates that the relay 16 should be replaced. If the relay 16 is replaced, the EEPROM location for that relay 16 is erased or otherwise reset. Relay identification numbers preferably are written (silk-screened) on the load board 10 and these numbers correspond to memory spaces where the click count for the particular relays are stored.

The relay tracking circuit 12 includes a power management capacitor 30 for providing power to the microcontroller when the load board 10 is undocked (and disconnected from its power source). The capacitor 30 maintains the power to the microcontroller when it is undocked to allow the relay count information to be transferred from the RAM 24 to the EEPROM 26. The voltage maintained by the capacitor 30 is sufficient to program the EEPROM 26. A 1F capacitor has been found to be sufficient for this purpose. Without the capacitor 30, the contents of the RAM 24 would be corrupted once power is taken off. Once the EEPROM 26 programming is completed, the microcontroller enters a WAIT mode to prevent the relay tracker circuit 12 from detecting a voltage difference on the load board 10 and mistakenly treating such voltage difference as a legitimate relay click. At this point, the power is provided to the microcontroller by the capacitor 30. The microcontroller exits the WAIT mode when power is turned on again, based on an interrupt pin that detects a low-to-high transition, and the microcontroller once again will start counting. If no power is supplied (no interrupt on IRQ pin), then the microcontroller remains in the WAIT mode until the capacitor 30 is discharged, at which point the microcontroller is turned off.

Figure 4:
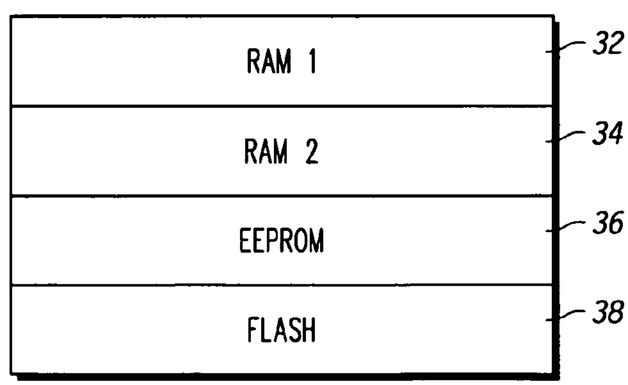
FIG. 4 is an example of a memory map of an embedded relay tracker in accordance with an embodiment of the present invention.

Referring now to FIG. 4, a memory map of the microcontroller is shown. The memory map includes a first RAM space 32, a second RAM space 34, an EEPROM space 36 and a FLASH memory space 38. The first RAM space 32 is used to store relay count information while the relay tracker circuit 12 is active. That is, when the load board 10 is powered up and connected to a tester head. The second RAM space 34 is used to mirror the first RAM space 32 to ensure accurate relay counts are stored in the EEPROM space 36. The EEPROM space 36 is used as a permanent storage space for storing the count information in the first and second RAM spaces 32 and 34 when the load board 10 is powered down or undocked. The FLASH memory space 38 is used to store firmware for the relay tracker circuit 12.

Figure 3:
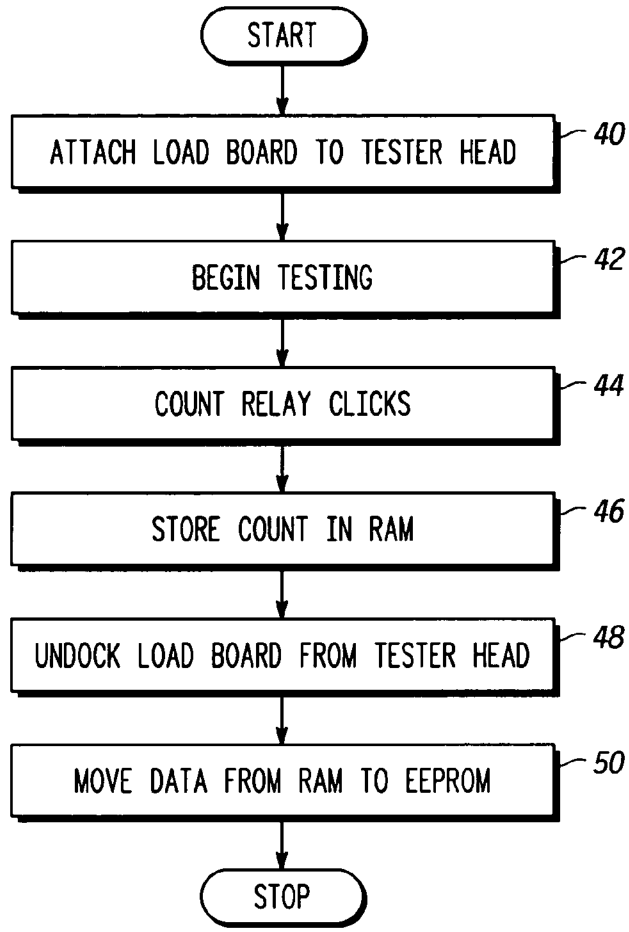
FIG. 3 is a flow chart illustrating a method of tracking relay usage using the embedded relay tracker of FIG. 2.

Referring now to FIG. 3, a flow chart illustrating the usage and operation of the embedded relay tracker circuit 12 is shown. In a first step 40, the load board 10 is connected to a test head and at step 42, device testing is initiated. As testing is performed, the relay clicking is counted at step 44 and the count information is stored in the RAM 24 at step 46. When the testing is completed, the load board 10 is undocked or disconnected from the test head, as indicated at step 48. When the load board 10 is powered down or disconnected from the test head, the count information stored in the RAM 24 is saved in the EEPROM 26, as indicated at step 50.

The embedded relay tracker circuit 12 provides accurate relay usage information that is used to determine when a relay needs to be replaced. By accurately tracking relay usage, as opposed to just performing periodic relay replacement, significant time and costs savings are realized. The relay tracker circuit 12 is relatively easy and inexpensive to build and readily interfaces with a computer via an RS-232 interface.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A relay tracker circuit for counting clicks of a plurality of relays on a load board, the relay tracker circuit comprising:

a controller including a counter for counting relay clicks of the plurality of relays;

a plurality of wires connecting the controller to the relays, wherein each time a relay switches, a signal is transmitted from the relay to the controller and the controller increments a counter therefor; and a memory connected to the counter for storing the count information for each relay, wherein each relay is allocated about four bytes of space in the memory.

2. The relay tracker circuit of claim 1, wherein the memory comprises RAM.

3. The relay tracker circuit of claim 2, wherein the RAM is integral with the controller.

4. The relay tracker circuit of claim 3, wherein the memory further comprises EEPROM.

5. The relay tracker circuit of claim 4, wherein the EEPROM is integral with the controller.

6. The relay tracker circuit of claim 5, wherein the count information is stored in the RAM while the load board is connected to a test head.

7. The relay tracker circuit of claim 6, further comprising a capacitor connected to the controller for providing power to the controller when the controller is disconnected from the test head.

8. The relay tracker circuit of claim 7, wherein the count information is moved from the RAM to the EEPROM when the load board is disconnected from the test head.

9. The relay tracker circuit of claim 1, wherein the plurality of wires comprise conductive traces.

10. A load board for applying simulated loads from a test system to one or more devices under test (DUTS), the load board comprising:

a plurality of conductive traces for transmitting signals from the test system to the DUTS;

a plurality of relays connected to the plurality of traces for performing signal switching; and an embedded relay tracker circuit connected to the plurality of relays for counting relay clicks and generating and storing relay usage information, wherein the embedded relay tracker circuit includes:

a controller including a counter for counting relay clicks of the plurality of relays;

a plurality of wires connecting the controller to the relays, wherein each time a relay switches, a signal is transmitted from the relay to the controller and the controller increments a counter therefor; and a memory connected to the counter for storing the count information for each relay, wherein each relay is allocated about four bytes of space in the memory.

11. The load board of claim 10, wherein the embedded relay tracker circuit includes an interface for connecting the tracker circuit to a computer and passing the relay usage information to the computer for display.

12. The load board of claim 10, wherein the memory comprises RAM.

13. The load board of claim 12, wherein the memory further comprises EEPROM.

14. The load board of claim 13, wherein the RAM and the EEPROM are integral with the controller.

15. The load board of claim 14, wherein the count information is stored in the RAM while the load board is connected to a test head.

16. The load board of claim 15, further comprising a capacitor connected to the controller for providing power to the controller when the load board is disconnected from a power source.

17. The load board of claim 16, wherein the count information is moved from the RAM to the EEPROM when the load board is disconnected from the test head.

* * * * *